United States Patent [19]

Hosoi

[11] Patent Number: 5,722,707
[45] Date of Patent: Mar. 3, 1998

[54] CLAMPING STRUCTURE IN AIR-TIGHTLY SEALABLE CONTAINER

[75] Inventor: Masato Hosoi, Niigata-ken, Japan

[73] Assignees: Shin-Etsu Polymer Co., Ltd.; Shin-Etsu Handotai Co., Ltd., both of Tokyo, Japan

[21] Appl. No.: 730,010

[22] Filed: Oct. 11, 1996

[30] Foreign Application Priority Data

Oct. 12, 1995 [JP] Japan .................. 7-289157

[51] Int. Cl.$^6$ ........................... B65D 45/30
[52] U.S. Cl. ................ 292/258; 292/DIG. 11
[58] Field of Search ............... 292/256.5, 256, 292/256.6, 256.65, 256.69, 257, 258, DIG. 11, 256.73; 220/691, 683, 693

[56] References Cited

U.S. PATENT DOCUMENTS

| | | | |
|---|---|---|---|
| 1,547,767 | 7/1925 | Lennon | 292/209 |
| 1,620,983 | 3/1927 | Nichols | 292/256.73 |
| 1,783,598 | 12/1930 | Bamford | 292/256 |
| 2,246,470 | 6/1941 | McArn | 292/256.5 |
| 2,357,246 | 8/1944 | Whitmyer | 292/256.73 |
| 2,503,222 | 4/1950 | Simons | 292/256.6 |
| 3,420,399 | 1/1969 | Heisler | 292/258 |
| 3,470,589 | 10/1969 | Bauman | 292/256.69 |
| 3,555,752 | 1/1971 | Boggert | 292/258 |
| 3,905,712 | 9/1975 | McConnell | 292/303 |
| 4,556,150 | 12/1985 | Ikumi | 292/258 |

Primary Examiner—Rodney M. Lindsey
Assistant Examiner—Gary Estremsky
Attorney, Agent, or Firm—Wenderoth, Lind & Ponack

[57] ABSTRACT

A clamping structure between a container body and a cover mountable thereon in an air-tightly sealable contained such as wafer carriers from semiconductor silicon wafers used for storage and transportation thereof. The clamping structure includes a container body and a cover mountable on the container body each provided with an encircling stepped flange around the open periphery. The stepped flanges on the container body and the cover are engageable each with the other. A pair of engagement tabs, each having an engagement groove, protrude from the open periphery of each of the container body and the cover at oppositely facing positions. Also, an engagement board which is resin plate is provided with a U-shaped openwork notch at the center thereof in a longitudinal direction. The notch is engageable at the upper part thereof with the engagement groove in the engagement tab of the cover and is engageable at the lower part thereof opposite to the upper part with the engagement groove in the engagement tab of the container body.

5 Claims, 8 Drawing Sheets

CLAMPING STRUCTURE IN AIR-TIGHTLY SEALABLE CONTAINER

BACKGROUND OF THE INVENTION

The present invention relates to a clamping structure in an air-tightly sealable container for holding of a plurality of plate-formed materials which must be protected from mechanical damages and contamination during transportation and storage, such as hard disks for magnetic recording media, fused silica glass plates for photomasks and semiconductor single crystal silicon wafers, referred to simply as silicon wafers hereinafter.

Various types of clamping structures in air-tightly sealable containers for the above mentioned purpose are disclosed, for example, in Japanese Patent Kokai 5-63068, Japanese Utility Model Publications 6-13114 and 6-1690, and elsewhere. The former two prior art references disclose a clamping structure in which the body or bottom of the container is provided on the open periphery thereof with a pair of protruded engagement members and the covering to be mounted on the body is provided on the open periphery with a pair of downwardly extending protruded hooks which are engageable each with one of the engagement members on the container body with intervention of a resilient gasket or packing. The last of the above mentioned prior art references discloses a clamping structure in which a plurality of protruded engagement tabs having a dovetailed tenon are provided on the open periphery of the container body and the covering and engagement boards are inserted into these engagement tabs along with insertion of the dovetailed tenons and the dovetail grooves in a slidable fashion to effect air-tight engagement of the container body and the covering.

The above described clamping structures of the prior art have disadvantages and problems as discussed below. Namely, the clamping structure using hooks disclosed in the former two references has a problem that it is a rather difficult matter to ensure evenness in the engagement of the container body and the covering unless the worker in the packaging work has a high degree of skillfulness and body strength because the covering mounted on the container body must be evenly pressed down to effect even compressive deformation of the gasket or packing between the open peripheries of the container body and the covering. When the numbers of the engagement members and the hooks are each four, for example, and the disconnecting work of the covering from the container body is performed first by disengagement of the two pairs of the engagement members and hooks followed by disengagement of the remaining two pairs, it is sometimes the case that the first released two hooks come again into engagement with the engagement members by resilience resulting in a decrease in the working efficiency with retardation due to complicacy of the manual working.

The clamping structure disclosed in the last mentioned prior art reference relying on sliding of an engagement board also has a problem of low working efficiency in the engagement works of the covering to the container body because the gasket or packing cannot or can hardly be deformed under compression by sliding the engagement board so that sliding of the engagement board must be effected by evenly pressing down the covering. In addition, sliding of the engagement board is necessarily accompanied by generation of dust particles due to friction resulting in eventual contamination of the materials contained in the container such as hard disks for magnetic recording media, fused silica glass plates for photomasks and silicon wafers as well as master plates for photomasks.

SUMMARY OF THE INVENTION

The present invention, which has been completed in view of the above described problems in the prior art, accordingly has as an object to provide a novel and reliable clamping structure for an air-tightly sealable container between the container body and the covering thereon, by which the work for engagement and disengagement of the parts can be conducted with high efficiency and the materials contained in the container can be protected from contamination due to dust particles.

Thus, the clamping structure of an air-tightly sealable container provided by the invention comprises:

(a) a container body and a covering mountable on the container body each provided with an encircling stepped belt around the open periphery, the stepped belts on the container body and the covering being engageable each with the other;

(b) a pair of engagement tabs each having an engagement groove and protruded on the open periphery of each of the container body and the covering at oppositely facing positions; and (c) an engagement board which is a resin plate provided with an openwork of a U-shaped notch at the center thereof in the longitudinal direction, the notch being engageable at the upper part thereof with the engagement groove in the engagement rib of the covering and engageable at the lower part thereof opposite to the upper part with the engagement groove in the engagement rib of the container body.

It is a preferable embodiment that a recess for the engagement of an elastic member filled with an elastic member is formed in each of the encircling stepped belts. Further, it is also a preferable embodiment that the engagement board is not uniform in the thickness but the thickness thereof is smaller in the areas just facing the U-shaped notch at the lateral legs thereof than in the areas apart from the notch.

DETAILED DESCRIPTION OF THE PREFERRED EMBODIMENTS

When the clamping structure of the invention is to be brought into the clamped state, the covering is first mounted on the container body in such a fashion that the encircling stepped belt or flange of the covering is mounted just on the encircling stepped belt or flange of the container body with intervention of an elastic sealing member therebetween so as to have the engagement rib of the covering to overlie the engagement tab of the container body. Thereafter, the engagement board is brought into engagement at the upper part or lower part thereof with the groove in the engagement rib of the covering. In the next place, a finger tip is put on the back surface of the engagement board at the lowermost part to serve as a fulcrum point and the engagement board is inserted at the lower part or upper part into the groove in the engagement rib of the container body. Then, the engagement board is bent archwise so as to be engaged at the lower part or upper part with the groove in the engagement tab of the container body. When the lowermost part of the engagement board is turned in the direction of the wall surface of the container body, the upper part or lower part of the engagement board approaches the engagement tab of the covering while the lower part or upper part of the engagement board approaches the engagement rib of the container body so that, as a consequence, the engagement rib of the container body approaches the engagement tab of the covering. By further turning of the lowermost part of the engagement board toward the direction of the wall surface of the container body, the container body and the covering are clamped to each other in a air-tight sealing condition with intervention of the elastic sealing member.

According to the first preferable embodiment mentioned in the Summary of the Invention, an elastic sealing member such as a gasket or packing can be put into the recess for the engagement of the elastic sealing member so that the air-tight condition of sealing can be improved to contribute to the prevention of dust particles from intrusion into the container.

According to the second preferable embodiment mentioned in the Summary of the Invention, the thickness of the engagement board is reduced along the lateral side areas facing the legs of the U-shaped openwork notch so that the board can readily and smoothly bent archwise to facilitate the engagement work of the notch thereof at the lower part with the engagement groove in the engagement tab of the container body.

In the following, the clamping structure of the invention is described in more detail by making reference to the accompanying drawing which illustrates an air-tightly sealable container for silicon wafers as a typical example of the material to be contained.

Figure 10:
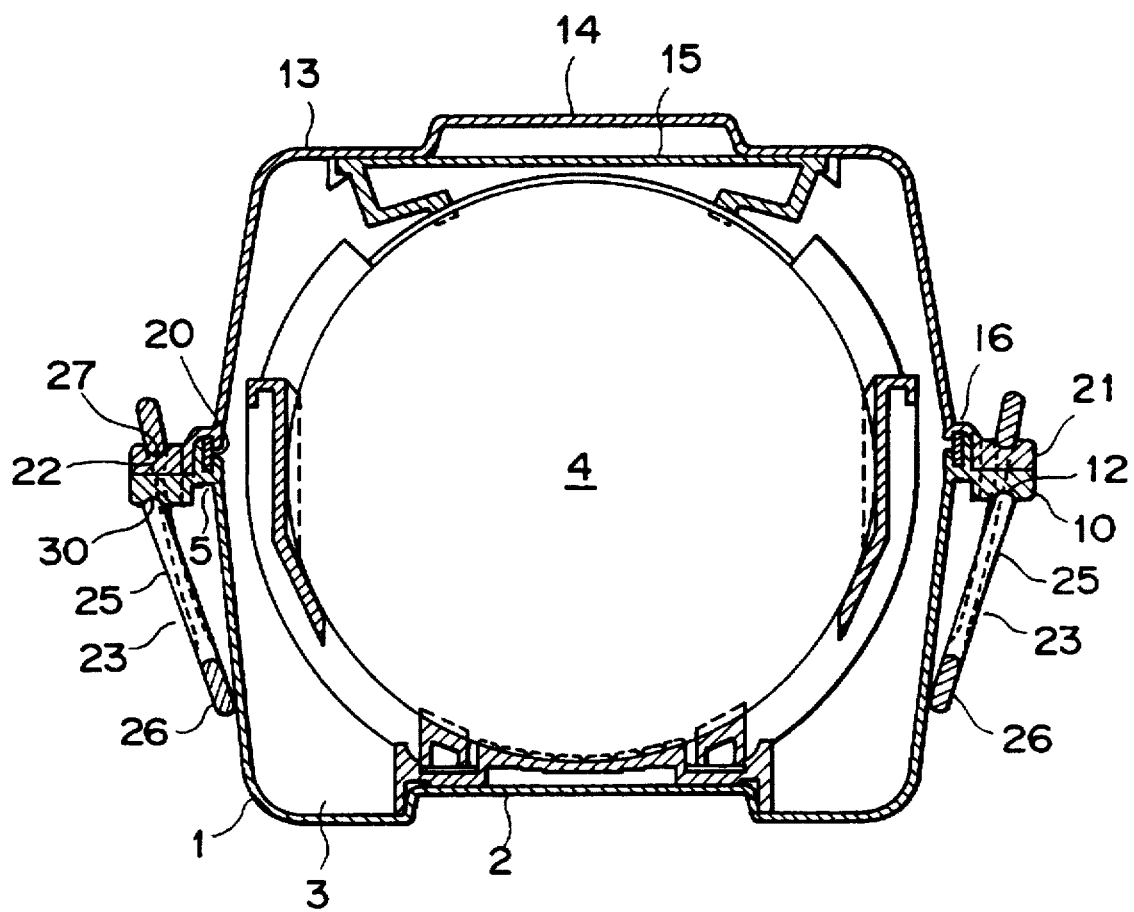
FIG. 10 is a vertical cross sectional view of the air-tightly sealable container having the clamping structure of the invention which is in the state after completion of the clamping movement.

As is shown in FIG. 10 and other figures illustrating an embodiment of the invention, encircling stepped flanges 5, 16 are formed on the upper open periphery of the container body 1 and on the lower open periphery of the cover 13, respectively. A first engagement tab 10 for the container body 1 and a second engagement tab 21 for the cover 13 protrude from the encircling stepped flange 5 of the container body 1 and from the encircling stepped flange 16 of the cover 13, respectively. These engagement tabs 10, 21 are clamped together by means of the engagement board 23.

The container body 1 is shaped in the form of an upwardly opening box having a bottom wall with a raised bottom 2 in the center area of the bottom. A plurality of silicon wafers 4 are contained in the container body 1 as held on a wafer cassette 3 in alignment keeping a narrow gap or space between each of the adjacent wafers 4. The container body 1 is made from a thermoplastic resin such as polycarbonate, polypropylene, polyethylene, PBT resins and the like though not particularly limitative thereto. An encircling stepped flange 5 is formed on the upper open periphery of the container body 1. The encircling stepped flange 5 is provided with a recess 8 having an approximately U-shaped cross section formed by the inner and outer upright segments 6, 7. A downward flange 9 is provided on the lower outer part of the outer upright segment 7. The downward flanges 9 on the opposite sides of the container body 1 are each provided with a protruding engagement tab 10 for the container body 1. The engagement tab 10 for the container body 1 has a recessed engagement groove 12 on the lower surface thereof.

Figure 4:
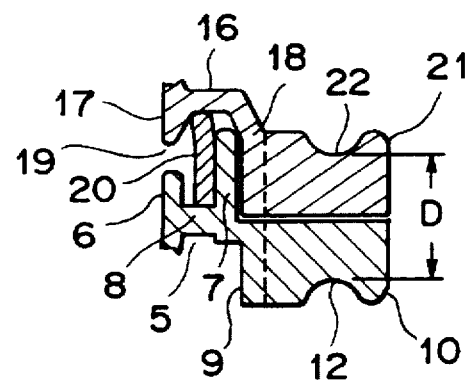
FIG. 4 is an enlarged partial cross sectional view showing a part of the clamping structure playing a principal role.

The cover 13 is shaped in the form of a downwardly opening box having a raised ceiling 14 in the center area of the top wall. A pair of wafer pressers 15 are provided on the lower surface of the top wall in a demountable fashion. Each of the wafer pressers 15 has a large number of wafer pressing pieces each of which is adapted to contact the upper periphery of one of the vertically held silicon wafers 4 to exhibit a protecting effect. The cover 13 is made also from a thermoplastic resin such as polycarbonate, polypropylene, polyethylene, PBT resins and the like. An encircling stepped flange 16 is formed on the downwardly opening periphery of the cover 13. The encircling stepped flange 16 is provided with downwardly extending vertical inner and outer segments 17, 18 in such a fashion that the outer vertical segment 18 comes into contact with the outer surface of the outer upright segment 7 of the container body 1. When these segments 18, 7 come into contact each with the other, a narrow space or, namely, a cavity 19 for the engagement of the gasket is formed between the inner vertical segment 17 and the U-shaped recess 8 of the container body 1 and this cavity 19 is filled with a frame-formed gasket 20 which serves to provide an air-tight seal (see FIG. 4). The outer vertical segments 18 at the opposite sides of the cover 13 are each provided with a rib 21 for engagement of the cover 13 extending in an approximately horizontal direction while this rib 21 has a recessed engagement groove 22 on the lower surface thereof.

Figure 2:
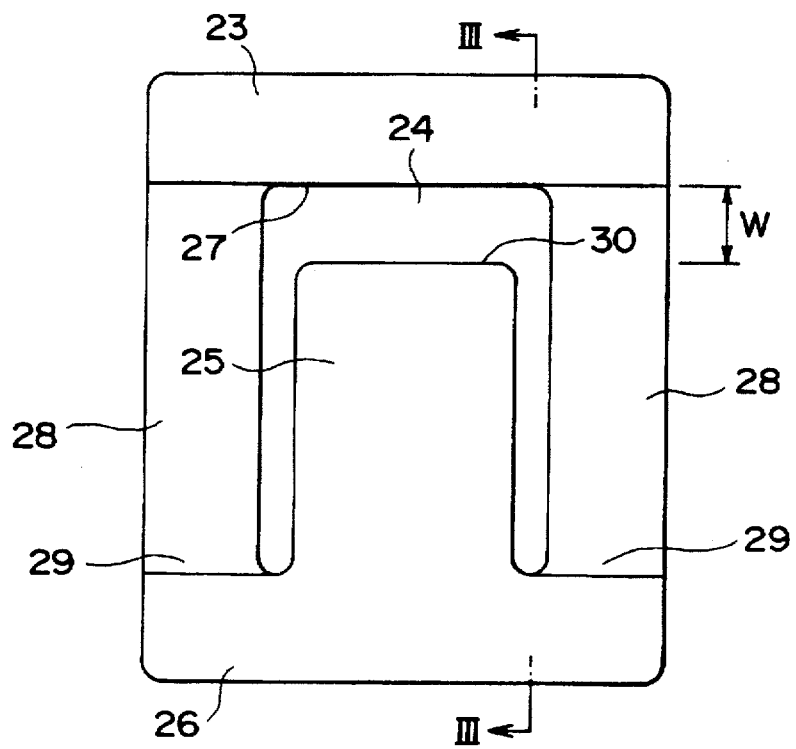
FIG. 2 is a plan view of an engagement board used in the clamping structure according to the invention.
Figure 3:
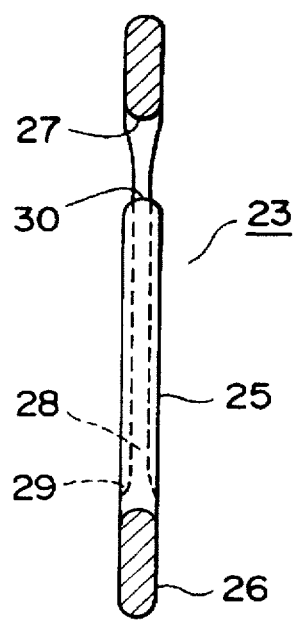
FIG. 3 is a cross sectional view of the engagement board illustrated in FIG. 2 as cut and viewed along the direction indicated by the arrows III—III in FIG. 2.

As is shown in FIGS. 2 and 3, the engagement board 23 is in a generally rectangular form having four rounded corners and provided at the center with an openwork notch 24 in the form of a letter U upside-down surrounding the tongue-formed holding piece 25. The engagement board 23 is made from a thermoplastic resin having an appropriate hardness and elastic resilience such as those based on polycarbonate resins, polystyrene resins, polyolefin resins, polyester resins and the like. If necessary as in the case of a relatively large container body 1, the thermoplastic resin can be compounded with a suitable reinforcing material such as carbon fibers, glass fibers and the like. The periphery of the engagement board 23 is chamfered along the upper and lower ends to have a rounded cross section as is illustrated in FIG. 3. The lower part 26 of the engagement board 23 serves as a point of force application. The upper part 27 of the board 23 above the notch 24, which also has a rounded periphery, serves as a fulcrum which comes into engagement with the engagement groove 22 in the engagement tab 21 of the cover 13. The thickness of the board 23 is smaller in the areas at the lateral sides facing the notch 24 or, namely, in the areas 28 on both sides of the tongue-formed holding piece 25 with intervention of the legs of the U-shaped notch 24 than in the areas above and below the notch 24 and the tongue 25 so that the resistance of the board 23 against archwise bending can be reduced so much. As is shown in FIG. 3, the lower part 29 of the thin-walled areas 28 has a gradually decreasing thickness to further decrease the resistance against archwise bending. The width W (see FIG. 2) of the horizontally extending segment of the U-shaped openwork notch 24, into which the engagement tabs 10, 21 of the container body 1 and the cover 13, respectively, are inserted, should be selected in such a fashion that the cover 13 is covered by the container body 1 and the width W is the same as or slightly smaller than the distance D (see FIG. 4) between the engagement grooves 12, 22 when the engagement tabs 10, 21 are at the closest proximity with the compressive deformation of the gasket 20. The cantilevered tongue 25 has a chamfered and rounded periphery along the upper free end thereof facing the fulcrum 27 so that this free end serves as a working point coming into engagement with the engagement groove 12 in the engagement tab 10 of the container body 1.

Figure 1:
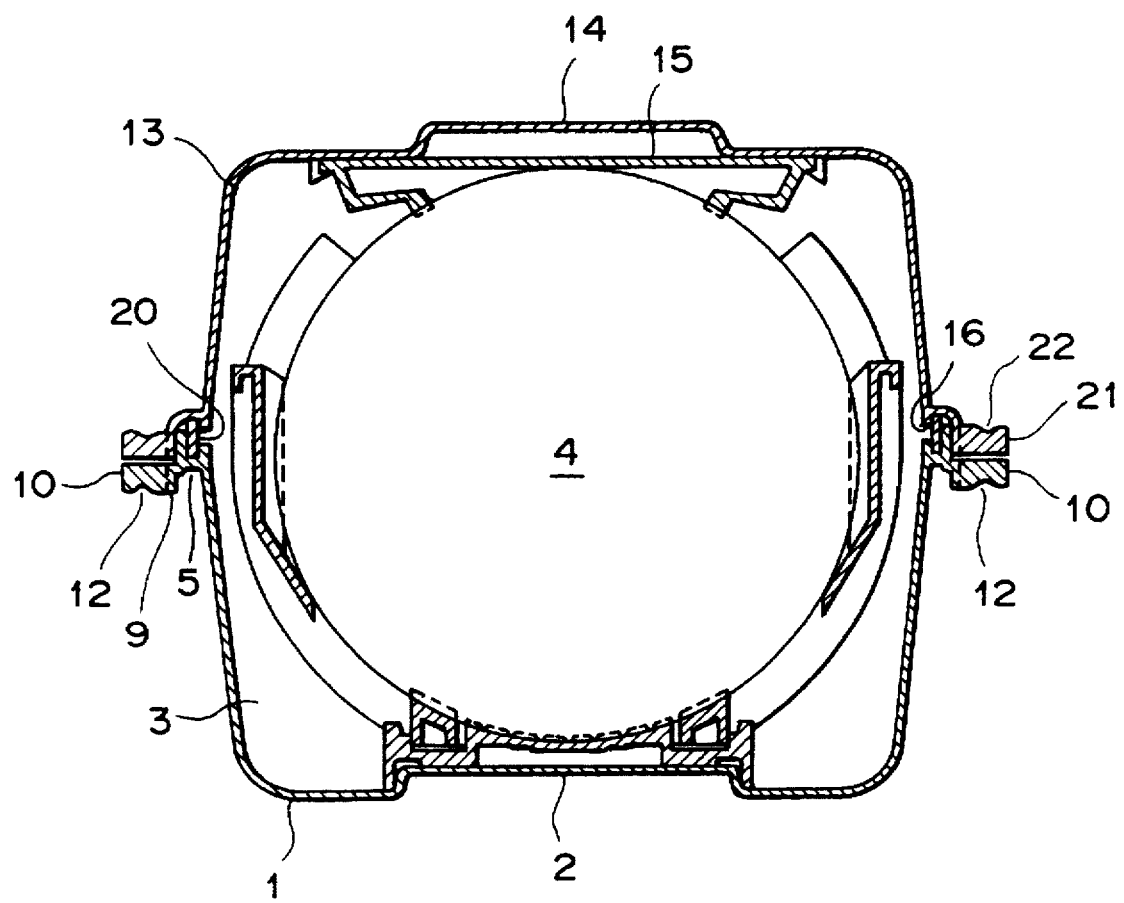
FIG. 1 is a vertical cross sectional view of an air-tightly sealable container having a clamping structure according to the invention.
Figure 5:
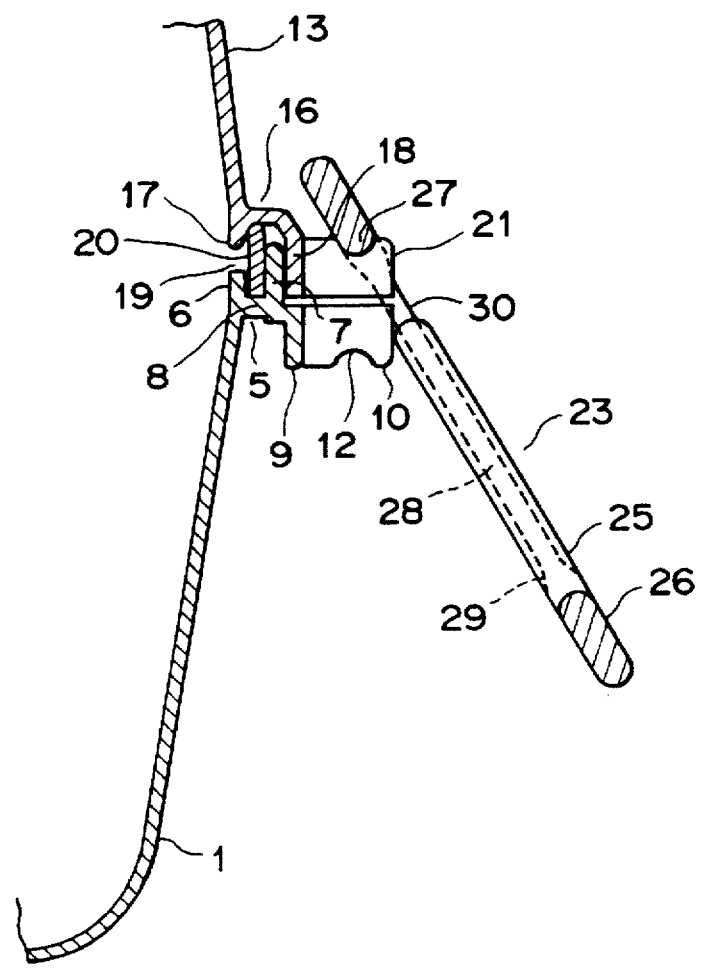
FIG. 5 is a cross sectional view of the clamping structure before start of the clamping movement.
Figure 6:
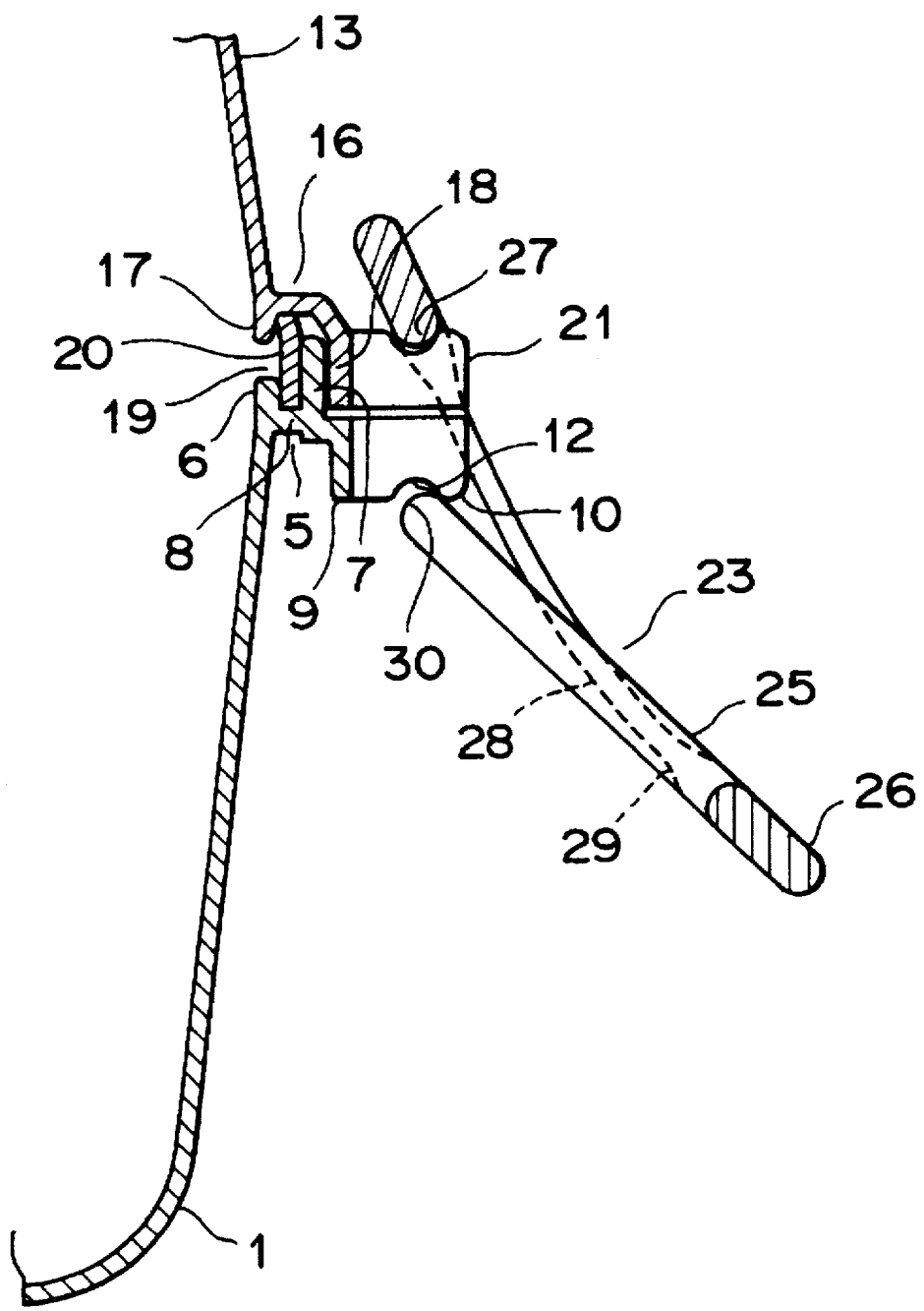
FIG. 6 is also a cross sectional view showing the clamping movement of the clamping structure to follow FIG. 5.
Figure 7:
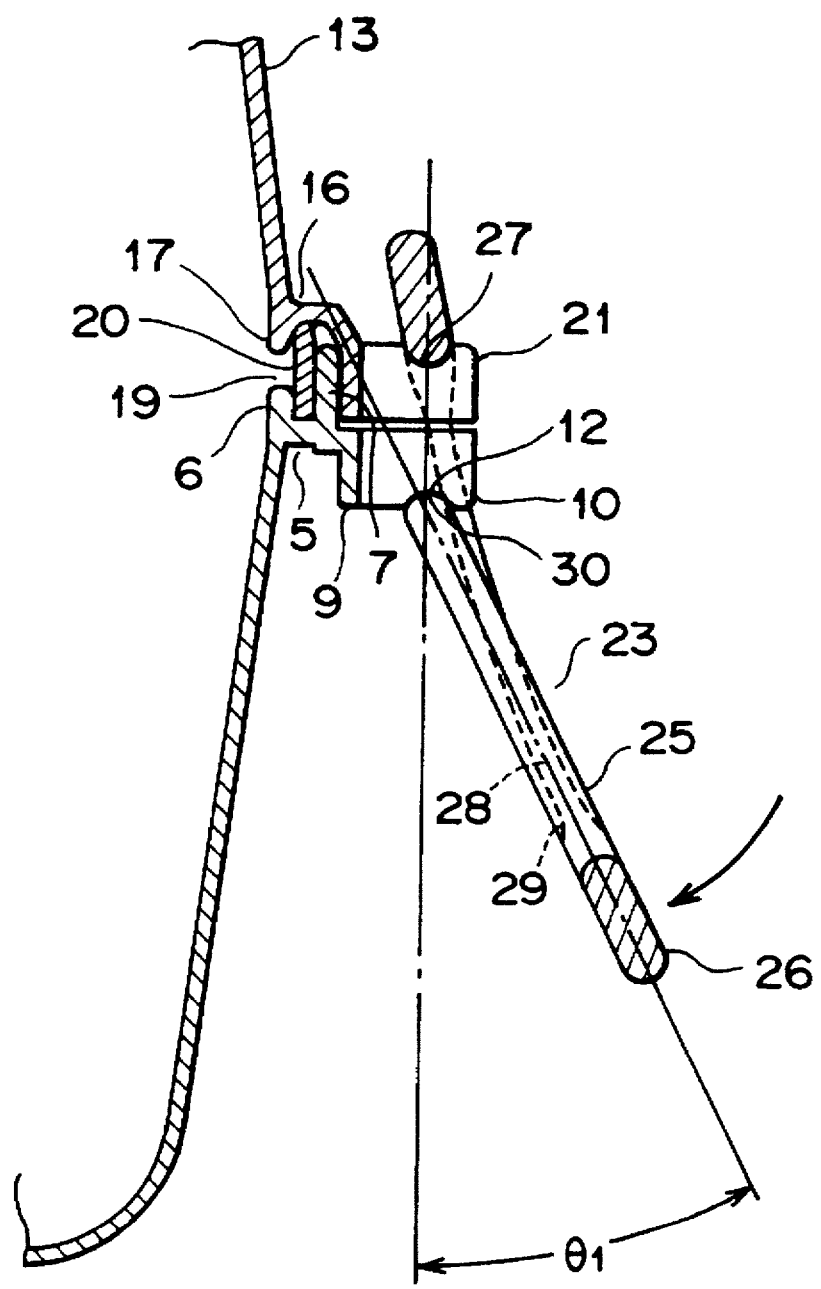
FIG. 7 is a further cross sectional view showing the clamping movement of the clamping structure to follow that shown in FIG. 6.

When the clamping structure of the invention is to be brought into a clamped state by setting the engagement board 23, accordingly, the cover 13 is mounted on the container body 1 so that the encircling stepped flange 16 of the cover 13 overlies the encircling stepped flange 5 of the container body 1 with intervention of a gasket 20 and the engagement tab 10 for the container body and the engagement rib 21 for the cover 13 are positioned the latter just on the former (see FIG. 1). Thereafter, the engagement board 23 is engaged at the fulcrum 27 with the engagement groove 22 of the cover 13 (see FIG. 5). At this moment, the working point 30 can no longer be engaged with the engagement groove 12 in the engagement tab 10 of the container body 1. The next step then is to put a finger tip on the back surface of the force-application point 26 of the engagement board 23 to make a temporary fulcrum (see the arrow in FIG. 6) to force the working point 30 of the tongue-formed holding piece 25 as a temporary force-application point into the engagement groove 12 in the engagement tab 10 of the container body 1 (see the arrow in FIG. 6) followed by archwise bending of the engagement board 23 along the thin-walled areas 28 to enable engagement of the working point 30 with the engagement groove 12 in the engagement tab 10 of the container body 1 (see FIG. 6). As is shown in FIG. 7, the force-application point 26, fulcrum 27 and working point 30 at this moment are not aligned on a single straight line but positioned each on one of triangular apexes, the force-application point 26 being positioned outside, i.e. right side on FIG. 7, of the straight line connecting the fulcrum 27 and the working point 30.

Figure 8:
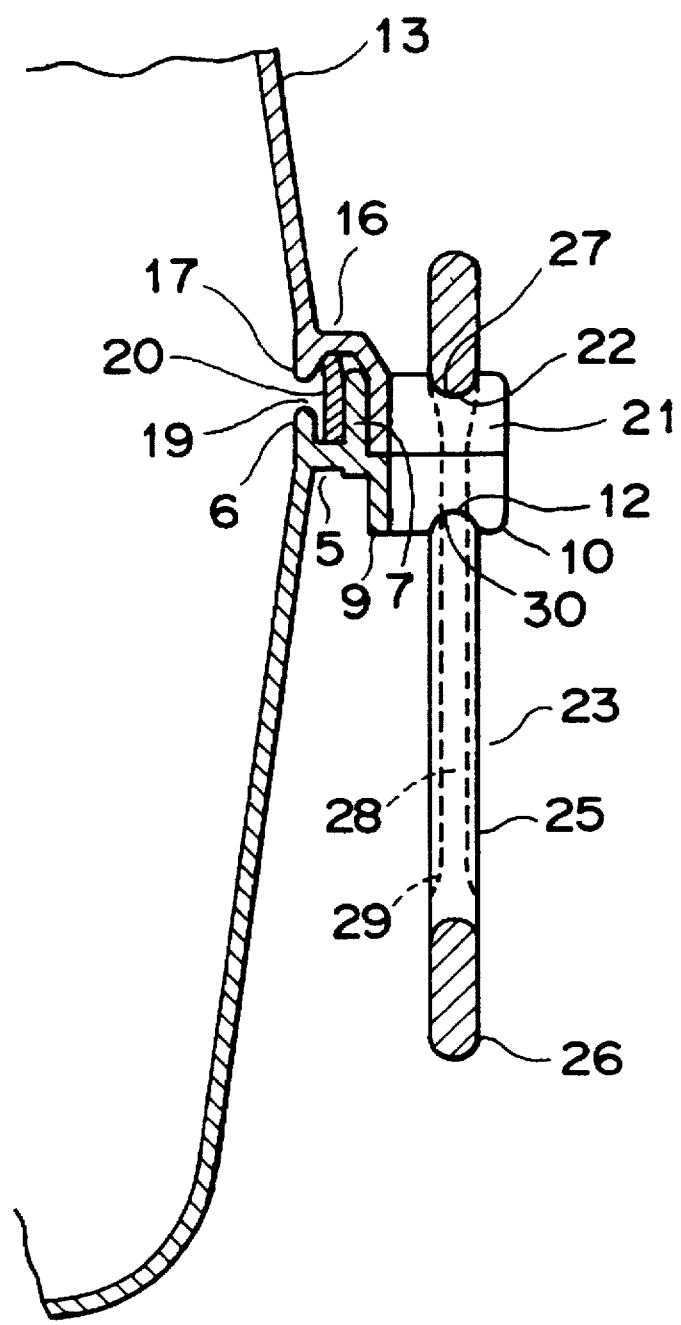
FIG. 8 is a still further cross sectional view showing the clamping movement of the clamping structure to follow that shown in FIG. 7.

In the next step, the force-application point 26 of the engagement board 23 is turned in the clockwise direction (see the arrow in FIG. 7) to fall in the direction of the wall surface of the container body 1 so that the fulcrum 27 and the working point 30 press the engagement tab 21 of the cover 13 and the engagement tab 10 of the container body 1, respectively, to decrease the distance therebetween so that the force-application point 26, fulcrum 27 and working point 30 are aligned on a straight line bringing the engagement tab 21 of the cover 13 into the closest proximity to the engagement tab 10 of the container body 1 (see FIG. 8). When the force-application point 26 in this state is turned in the clockwise direction (see the arrow in FIG. 8) to further fall toward the wall surface of the container body 1, the gasket 20 is deformed to generate a resilient force by which the force-application point 26 is brought inside, i.e. left side on FIG. 9, of the straight line connecting the fulcrum 27 and the working point 30 to effect an air-tight and stable closure of the gap between the container body 1 and the cover 13 by means of the gasket 20 intervening therebetween.

Figure 9:
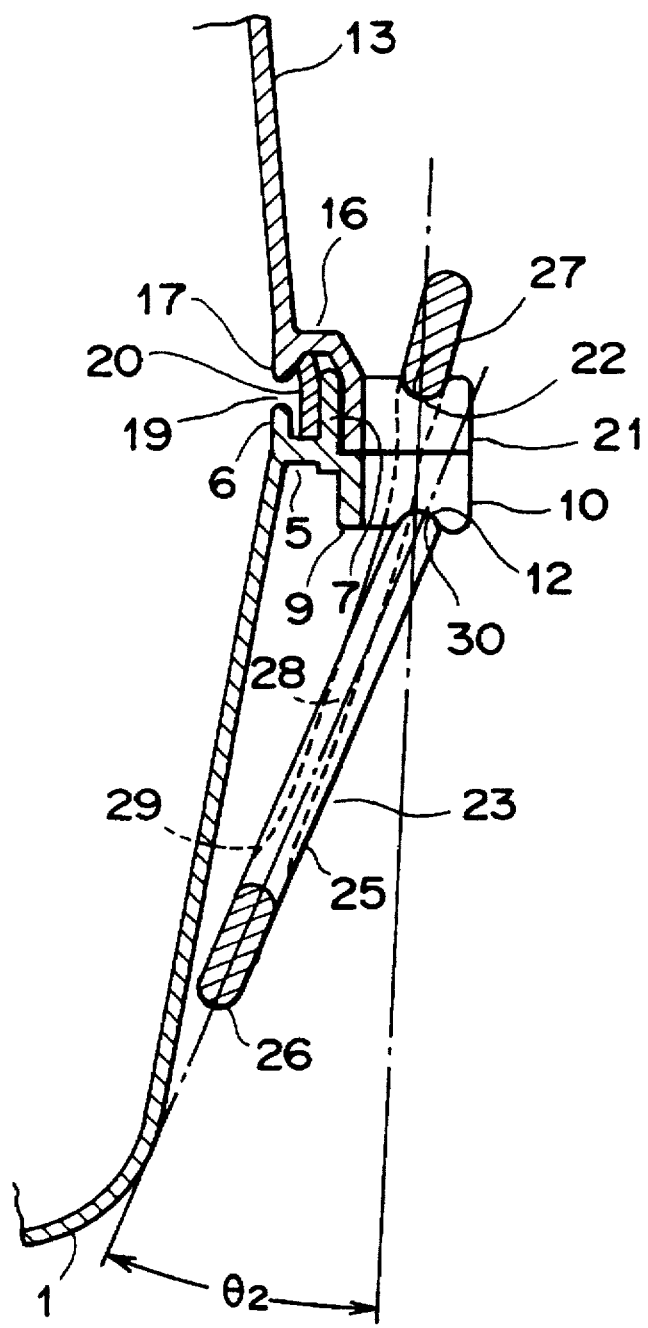
FIG. 9 is a cross sectional view showing the clamping structure after completion of the clamping movement to follow that shown in FIG. 8.

After completion of the above described series of movements, the engagement tab 10 of the container body 1 and the engagement tab 21 of the cover 13 are slightly pulled apart to make a narrow clearance therebetween as compared with the state shown in FIG. 9. This clearance, however, is narrower than in the case of FIG. 8 so that the engagement tab 10 for the container body 1 and the engagement tab 21 for the cover 13 are held under an appropriate pressing force. This desirable state can be accomplished by shaping the engagement board 23, engagement tab 10 for the container body 1 and the engagement tab 21 for the cover 13 in such a fashion as is described below. Namely, in the state before clamping where the force-application point 26 is positioned outside of the straight line connecting the fulcrum point 27 and the working point 30, the angle between the straight line and the holding piece 25 is taken as $\theta_1$ in degrees (see FIG. 7) and, in the state after completion of clamping where the force-application point 26 is positioned inside of the straight line connecting the fulcrum point 27 and the working point 30, the angle between the straight line and the holding piece 25 is taken as 12 in degrees (see FIG. 9). Then, it is desirable that the dimensions of the engagement board 23, engagement tab 10 for the container body 1 and the engagement tab 21 for the cover 13 satisfy the inequality of $\theta_1 > \theta_2$ or, preferably, $\theta_2 + 10 > \theta_1 > \theta_2 + 5$.

When the cover 13 is to be removed from the container body 1 by removing the engagement board 23, the force-application point 26 of the engagement board 23 is turned in the counterclockwise direction to release clamping and the thin-walled areas 28 are bent archwise to effect disengagement of the working point 30 from the engagement groove 12 of the engagement tab 10 for the container body 1 followed by the disengagement of the fulcrum 27 of the engagement board 23 from the engagement groove 22 of the engagement tab 21 for the cover 13.

When a wafer carrier is constructed according to the above given disclosure for the clamping structure, it is absolutely no longer necessary to keep evenness of depression of the covering to effect engagement of hooks with the engagement board 23, because pressing deformation of a gasket is not required, so that the workers in the packaging work are not required to have a high degree of body strength and/or skillfulness and the productivity of the packaging works can be greatly improved. The working efficiency can also be improved because the gasket 20 need not be compressively deformed by sliding the engagement board 23 along with the absence of the problem due to generation of dust particles by rubbing in the sliding of the engagement board 23 to ensure a highly clean condition so that the silicon wafers 4 can be prevented from contamination. Further, the engagement board 23 is handled in a toggle-like manner so that the silicon wafers contained in the wafer carrier can be easily and reliably taken out therefrom. The engagement board 23 has a reduced thickness in the thin-walled areas 28 to facilitate deep archwise bending of the board 23 so that the working point 30 is smoothly brought into engagement with the engagement groove 12.

What is claimed is:

1. A sealable container comprising:
   a container body having an open periphery and a stepped flange extending from and surrounding said open periphery of said container body;

a cover mountable on said container body, said cover having an open periphery and a stepped flange extending from and surrounding said open periphery of said cover, wherein said stepped flange of said cover engages said stepped flange of said container body when said cover is mounted on said container body;

a first engagement tab protruding from said stepped flange of said container body, said first engagement tab having a first engagement groove formed thereon;

a second engagement tab protruding from said stepped flange of said cover and located so as to directly oppose said first engagement tab, said second engagement tab having a second engagement groove formed thereon; and an engagement plate provided with a U-shaped opening formed in a planar face thereof with respect to a longitudinal direction of said plate, said U-shaped opening having two leg portions and a base portion interconnecting an end of each of said two leg portions, wherein, in an engaging position of said engagement plate, said first and second engagement tabs extend into said base portion of said U-shaped opening so that opposing portions of said engagement plate are received in said first and second engagement grooves.

2. The sealable container as claimed in claim 1, wherein said stepped flange of said container body defines a first recess and said stepped flange of said cover defines a second recess which opposes said first recess when said cover is positioned on said container body.

3. The sealable container as claimed in claim 2, further comprising an elastic member received in and engaging said opposing first and second recesses when said cover is positioned on said container body.

4. The sealable container as claimed in claim 1, wherein said container body, said cover, and said engagement plate are formed of a thermoplastic resin material.

5. The sealable container as claimed in claim 1, wherein said engagement plate includes areas of reduced thickness relative to the remaining areas of said plate, and said areas of reduced thickness are located laterally outside of said legs of said U-shaped opening.

* * * * *